US009991870B2

(12) United States Patent
Gilbert et al.

(10) Patent No.: US 9,991,870 B2
(45) Date of Patent: Jun. 5, 2018

(54) SURFACE ACOUSTIC WAVE (SAW) RESONATOR

(71) Applicant: Avago Technologies General IP (Singapore) Pte. Ltd., Singapore (SG)

(72) Inventors: Stephen Roy Gilbert, San Francisco, CA (US); Richard C. Ruby, Menlo Park, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 110 days.

(21) Appl. No.: 15/009,801

(22) Filed: Jan. 28, 2016

(65) Prior Publication Data

US 2017/0063331 A1    Mar. 2, 2017

Related U.S. Application Data

(63) Continuation-in-part of application No. 14/835,679, filed on Aug. 25, 2015.

(51) Int. Cl.
| | |
|---|---|
| *H03H 9/25* | (2006.01) |
| *H03H 9/64* | (2006.01) |
| *H03H 9/09* | (2006.01) |
| *H03H 9/02* | (2006.01) |

(52) U.S. Cl.
CPC .... *H03H 9/02574* (2013.01); *H03H 9/02818* (2013.01); *H03H 9/02866* (2013.01); *H03H 9/6483* (2013.01)

(58) Field of Classification Search
CPC .......... H03H 9/02543; H03H 9/02574; H03H 9/02614; H03H 9/02622; H03H 9/02653; H03H 9/02866; H03H 9/64; H03H 9/6496

USPC .................................................. 333/193–195
See application file for complete search history.

(56) References Cited

U.S. PATENT DOCUMENTS

| | | | |
|---|---|---|---|
| 3,887,887 | A | 6/1975 | Wagers |
| 4,163,201 | A | 7/1979 | Takahashi |
| 4,388,600 | A | 6/1983 | Wakino |
| 4,879,487 | A | 11/1989 | Sugai |
| 5,446,330 | A | 8/1995 | Eda |
| 5,708,402 | A | 1/1998 | Hachisu |

(Continued)

FOREIGN PATENT DOCUMENTS

| | | |
|---|---|---|
| JP | 56-114423 A | 9/1981 |
| JP | 05-063500 A | 3/1993 |

(Continued)

OTHER PUBLICATIONS

W.P. Maszara; "Silicon-on-Insulator by Wafer Bonding: A Review"; The Electrochemical Society, Inc., Journal of Electrochemical Society, vol. 138, No. 1, Jan. 1991, pp. 341-347.*

(Continued)

*Primary Examiner* — Barbara Summons

(57) ABSTRACT

A surface acoustic wave (SAW) resonator includes a piezoelectric layer disposed over a substrate, and a plurality of electrodes disposed over the first surface of the piezoelectric layer. A layer is disposed between the substrate and the piezoelectric layer. A silicon layer disposed between a first surface of the layer and a second surface of the piezoelectric layer. A first surface of the silicon layer has a smoothness sufficient to foster atomic bonding between the first surface of the silicon layer and the second surface of the piezoelectric layer.

38 Claims, 7 Drawing Sheets

(56) References Cited

U.S. PATENT DOCUMENTS

| | | | |
|---|---|---|---|
| 6,060,818 | A | 5/2000 | Ruby et al. |
| 7,148,769 | B2 | 12/2006 | Takano |
| 7,213,314 | B2 | 5/2007 | Abbott |
| 7,331,092 | B2 | 2/2008 | Miura |
| 7,501,912 | B2 | 3/2009 | Jamneala et al. |
| 7,504,759 | B2 | 3/2009 | Sobu |
| 7,609,129 | B2 | 10/2009 | Yokota |
| 7,675,387 | B2 | 3/2010 | Sakiyama |
| 7,728,485 | B2 | 6/2010 | Handtmann et al. |
| 7,800,464 | B2 | 9/2010 | Tajima |
| 7,939,987 | B1 | 5/2011 | Solal et al. |
| 8,035,464 | B1 | 10/2011 | Abbott et al. |
| 6,060,818 | C1 | 12/2011 | Ruby et al. |
| 8,390,397 | B2 | 3/2013 | Jamneala et al. |
| 8,587,391 | B2 | 11/2013 | Gilbert et al. |
| 8,866,365 | B2 | 10/2014 | Hori et al. |
| 8,946,904 | B2 | 2/2015 | Railkar et al. |
| 8,997,320 | B2 | 4/2015 | Fuyutsume |
| 9,243,316 | B2 | 1/2016 | Larson, III et al. |
| 9,391,666 | B1 | 7/2016 | Handtmann et al. |
| 2003/0022412 | A1 | 1/2003 | Higgins et al. |
| 2003/0199105 | A1* | 10/2003 | Kub .................. H01L 21/76254 438/3 |
| 2004/0226162 | A1 | 11/2004 | Miura |
| 2005/0088257 | A1 | 4/2005 | Ruby et al. |
| 2006/0043822 | A1 | 3/2006 | Yokota |
| 2008/0024037 | A1 | 1/2008 | Tamura |
| 2008/0106354 | A1 | 5/2008 | Kando |
| 2014/0132117 | A1 | 5/2014 | Larson, III |
| 2014/0227434 | A1 | 8/2014 | Iwamoto |
| 2014/0320234 | A1 | 10/2014 | Takemura |
| 2015/0069882 | A1 | 3/2015 | Umeda et al. |
| 2015/0171823 | A1 | 6/2015 | Brawley |
| 2017/0063329 | A1 | 3/2017 | Gilbert et al. |
| 2017/0063330 | A1 | 3/2017 | Gilbert et al. |
| 2017/0063332 | A1 | 3/2017 | Gilbert et al. |
| 2017/0063333 | A1 | 3/2017 | Gilbert et al. |
| 2017/0063338 | A1 | 3/2017 | Gilbert et al. |
| 2017/0063339 | A1 | 3/2017 | Burak et al. |
| 2017/0085247 | A1 | 3/2017 | Ruby et al. |
| 2017/0222619 | A1 | 8/2017 | Iwamoto |
| 2017/0250673 | A1 | 8/2017 | Ruby et al. |
| 2017/0302251 | A1 | 10/2017 | Ruby et al. |

FOREIGN PATENT DOCUMENTS

| | | | |
|---|---|---|---|
| JP | 05-283971 | A | 10/1993 |
| JP | 2000-278090 | A | 10/2000 |
| JP | 2001-053579 | A | 2/2001 |
| JP | 2002-330047 | A | 11/2002 |
| JP | 2005-229455 | A | 8/2005 |
| JP | 2005-347295 | | 12/2005 |
| JP | 4723207 | B2 | 7/2011 |
| JP | 2012-015767 | A | 1/2012 |
| JP | 2015-115870 | A | 6/2015 |
| JP | 5814727 | B2 | 11/2015 |

OTHER PUBLICATIONS

Kobayashi et al., "A Study on Temperature-Compensated Hybrid Substrates for Surface Acoustic Wave Filters", 2010 IEEE International Ultrasonics Symposium Proceedings, p. 637-640.

Office Action dated Jun. 16, 2017 in co-pending U.S. Appl. No. 14/866,273, 11 pages.

Office Action dated Jun. 29, 2017 in co-pending U.S. Appl. No. 14/866,394, 15 pages.

Office Action dated Dec. 1, 2016 in co-pending U.S. Appl. No. 14/835,679, 17 pages.

English language machine translation of JP2001-053579, published Feb. 23, 2001, 7 pages.

English language machine translation of JP05-063500, published Mar. 12, 1993, 3 pages.

English language machine translation of JP56-114423, published Sep. 9, 1981, 2 pages.

English language machine translation of JP2000-278090, published Oct. 6, 2000, 5 pages.

English language machine translation of JP2002-330047, published Nov. 15, 2002, 9 pages.

English language machine translation of JP2015-115870, published Jun. 22, 2015, 2 pages.

English language machine translation of JP2012-15767, published Jan. 19, 2012, 3 pages.

Office Action dated Dec. 6, 2016 in co-pending U.S. Appl. No. 14/866,273, 17 pages.

Office Action dated Dec. 12, 2016 in co-pending U.S. Appl. No. 14/866,394, 19 pages.

English language machine translation of JP4723207, published Jul. 13, 2011, 14 pages.

English language machine translation of JP2005-229455, published Aug. 25, 2005, 9 pages.

English language machine translation of JP5814727, published Nov. 17, 2015, 16 pages.

Advisory Action dated Aug. 14, 2017 in co-pending U.S. Appl. No. 14/866,273, 6 pages.

Office Action dated Sep. 15, 2017 in co-pending U.S. Appl. No. 14/866,273, 13 pages.

Advisory Action dated Aug. 11, 2017 in co-pending U.S. Appl. No. 14/866,394, 4 pages.

Office Action dated Sep. 18, 2017 in co-pending U.S. Appl. No. 14/866,394, 15 pages.

Office Action dated Sep. 28, 2017 in co-pending U.S. Appl. No. 15/056,664, 22 pages.

English language machine translation of JP2005-347295, published Dec. 15, 2005, 7 pages.

Kochar, et al., "NSPUDT using C-Axis tilted ScAlN Thin Film", Frequency Control Symposium and the European Frequency and Time Forum (FCS), 2015 Joint Conference of the IEEE International, Apr. 2015, 4 pages.

Final Office Action dated Jan. 2, 2018 in co-pending U.S. Appl. No. 14/866,273, 8 pages.

Co-pending U.S. Appl. No. 15/720,002, filed Sep. 29, 2017.

* cited by examiner

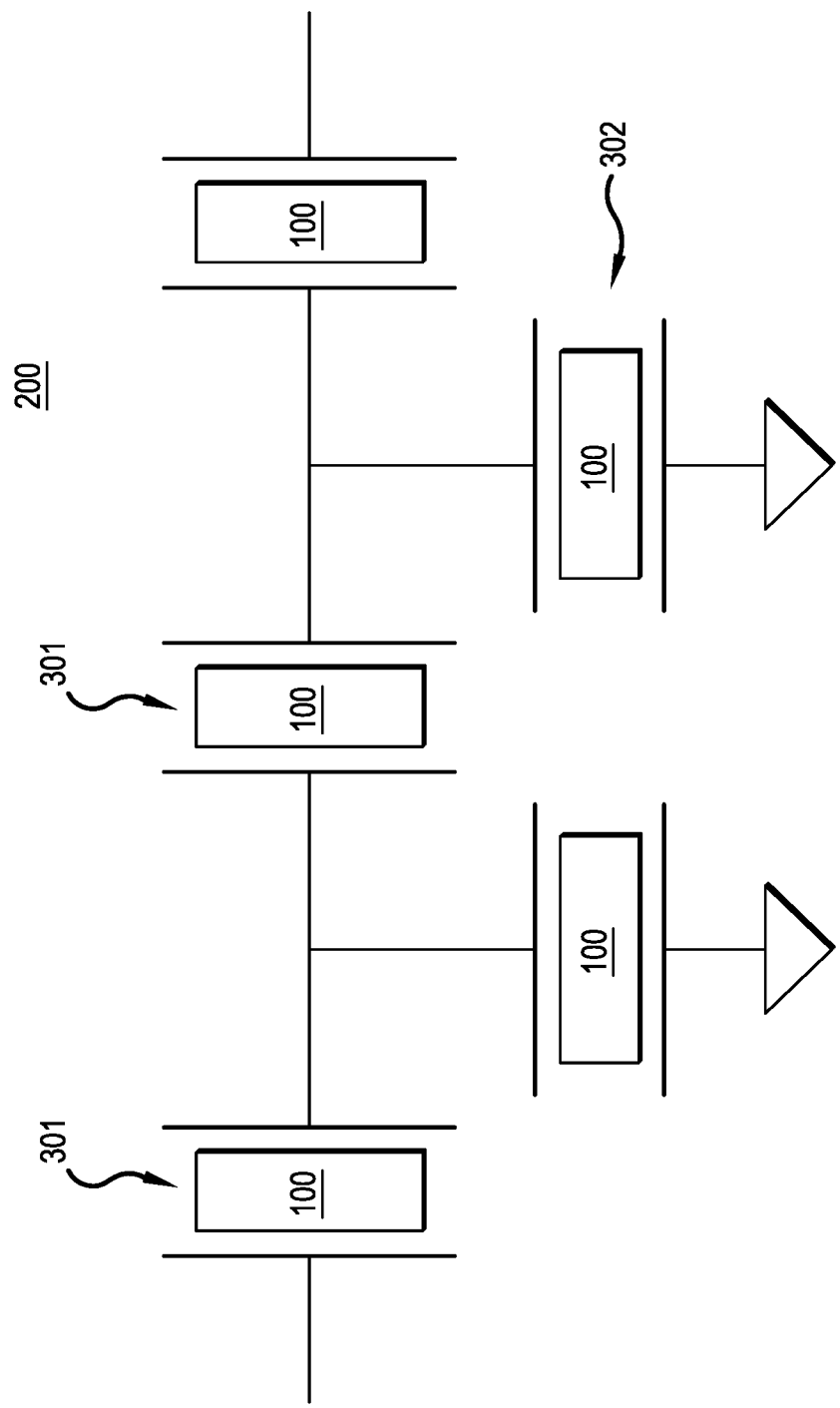

SURFACE ACOUSTIC WAVE (SAW) RESONATOR

CROSS REFERENCE TO RELATED APPLICATIONS

This application is a continuation-in-part under 37 C.F.R. § 1.53(b) of, and claims priority under 35 U.S.C. § 120 from, U.S. patent application Ser. No. 14/835,679 filed on Aug. 25, 2015 naming Stephen Roy Gilbert, et al. as inventors. The entire disclosure of U.S. patent application Ser. No. 14/835,679 is specifically incorporated herein by reference.

BACKGROUND

Electrical resonators are widely incorporated in modern electronic devices. For example, in wireless communications devices, radio frequency (RF) and microwave frequency resonators are used in filters, such as filters having electrically connected series and shunt resonators forming ladder and lattice structures. The filters may be included in a duplexer (diplexer, triplexer, quadplexer, quintplexer, etc.) for example, connected between an antenna (there could be several antennas like for MIMO) and a transceiver for filtering received and transmitted signals.

Various types of filters use mechanical resonators, such as surface acoustic wave (SAW) resonators. The resonators convert electrical signals to mechanical signals or vibrations, and/or mechanical signals or vibrations to electrical signals.

While certain surface modes are desired, certain standing spurious modes can exists between the opposing faces of the piezoelectric material of the SAW resonator. These spurious modes are parasitic, and can impact the performance of filters comprising SAW resonators.

What is needed, therefore, is a SAW resonator structure that overcomes at least the shortcomings of known SAW resonators described above.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIG. 2 is a simplified schematic block diagram of a filter comprising a SAW resonator structure according to a representative embodiment.

DETAILED DESCRIPTION

Figure 1A:
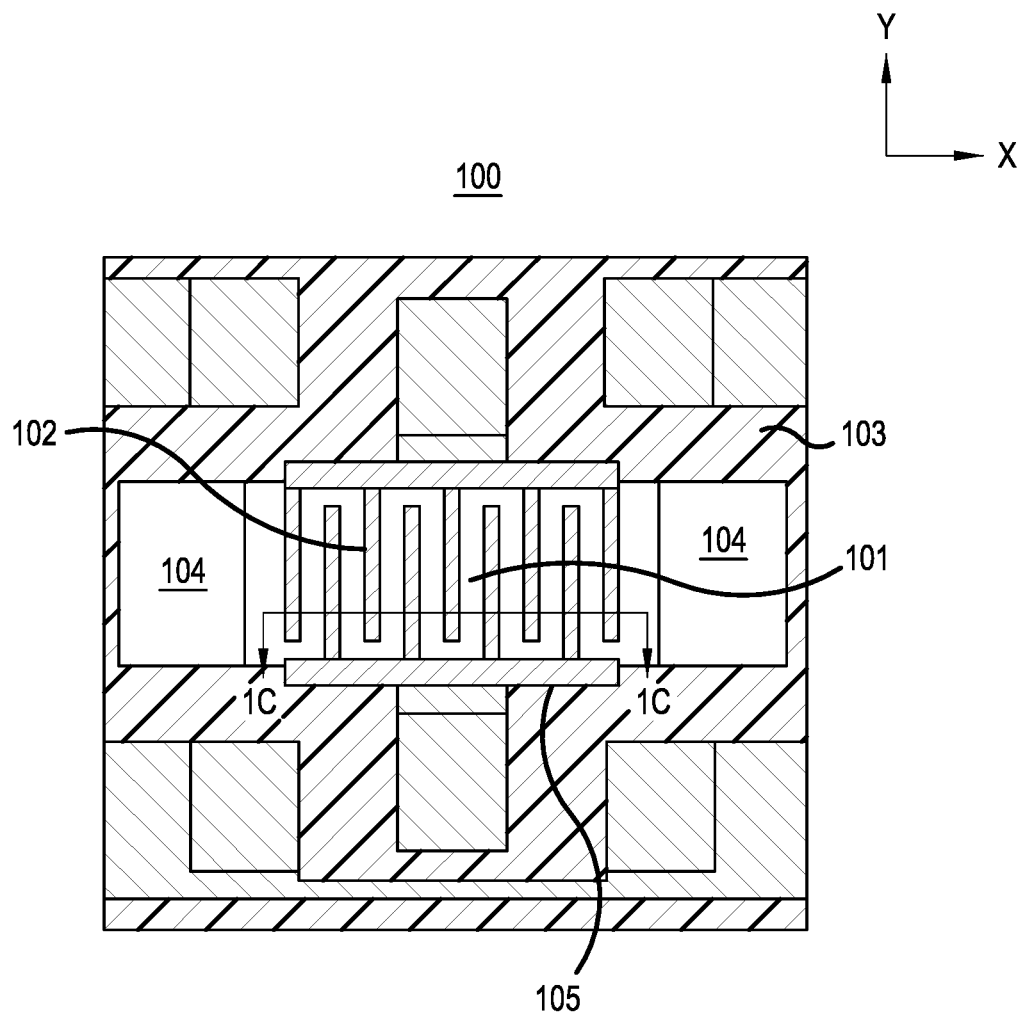
FIG. 1A is a top view of a SAW resonator structure according to a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

It is to be understood that the terminology used herein is for purposes of describing particular embodiments only, and is not intended to be limiting. Any defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to with acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be "below" that element. Similarly, if the device were rotated by 90° with respect to the view in the drawings, an element described "above" or "below" another element would now be "adjacent" to the other element; where "adjacent" means either abutting the other element, or having one or more layers, materials, structures, etc., between the elements.

In accordance with a representative embodiment, a SAW resonator structure comprises a substrate having a first surface and a second surface. The first surface of the substrate has a plurality of features. The SAW resonator structure also comprises a piezoelectric layer disposed over the substrate. The piezoelectric layer has a first surface and a second surface. The SAW resonator structure also comprises a plurality of electrodes disposed over the first surface of the piezoelectric layer. The plurality of electrodes is configured to generate surface acoustic waves in the piezoelectric layer. A layer is disposed over the first surface of the substrate, and the layer has a first surface and a second surface. The SAW resonator structure also comprises a silicon layer disposed between the first surface of the layer and the second surface of the piezoelectric layer. The first surface of the silicon layer having a smoothness sufficient to foster atomic bonding between the first surface of the silicon layer and the second surface of the piezoelectric layer. The plurality of features reflects acoustic waves and reduces the incidence of spurious modes in the piezoelectric layer.

FIG. 1A is a top view of a SAW resonator structure 100 according to a representative embodiment. Notably, the SAW resonator structure 100 is intended to be merely illustrative of the type of device that can benefit from the present teachings. Other types of SAW resonators, including, but not limited to dual mode SAW (DMS) resonators, and structures therefor, are contemplated by the present teachings. The SAW resonator structure 100 of the present teachings is contemplated for a variety of applications. By way of example, and as described in connection with FIG. 3, a plurality of SAW resonator structures 100 can be connected in a series/shunt arrangement to provide a ladder filter.

The SAW resonator structure 100 comprises a piezoelectric layer 103 disposed over a substrate (not shown in FIG. 1A). In accordance with representative embodiments, the piezoelectric layer 103 comprises on of lithium niobate ($LiNbO_3$), which is commonly abbreviated LN; or lithium tantalate ($LiTaO_3$), which is commonly abbreviated LT.

The SAW resonator structure 100 comprises an active region 101, which comprises a plurality of interdigitated electrodes 102 disposed over a piezoelectric layer 103, with acoustic reflectors 104 situated on either end of the active region 101. In the presently described representative embodiment, electrical connections are made to the SAW resonator structure 100 using the busbar structures 105.

As is known, the pitch of the interdigitated resonator electrodes 102 determines the resonance conditions, and therefore the operating frequency of the SAW resonator structure 100. Specifically, the interdigitated electrodes 102 are arranged with a certain pitch between them, and a surface wave is excited most strongly when its wavelength λ is the same as the pitch of the electrodes. The equation $f_0 = v/\lambda$ describes the relation between the resonance frequency ($f_0$), which is generally the operating frequency of the SAW resonator structure 100, and the propagation velocity (v) of a surface wave. These SAW waves comprise Rayleigh or Leaky waves, as is known to one of ordinary skill in the art, and form the basis of function of the SAW resonator structure 100.

Figure 1B:
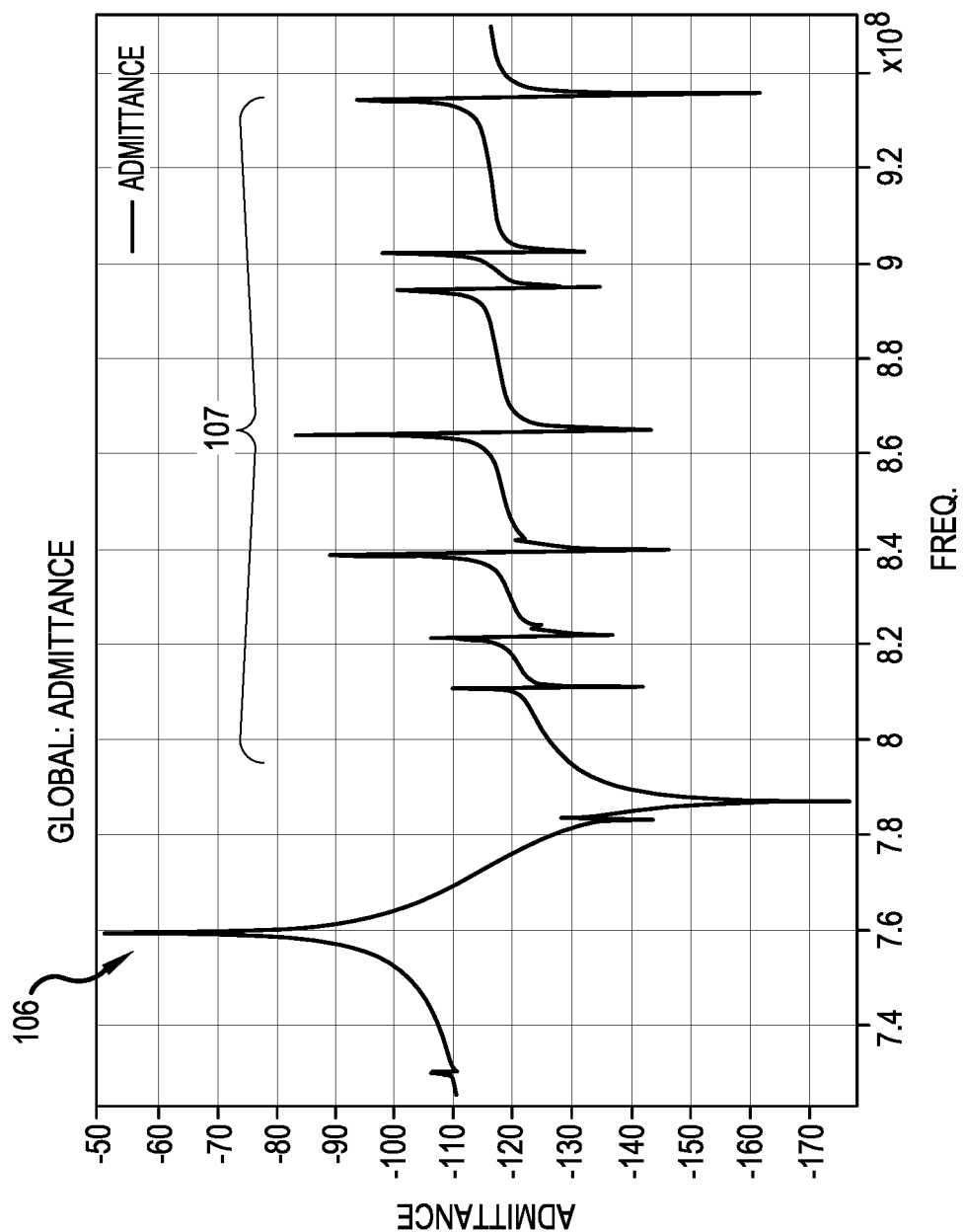
FIG. 1B is a graph of admittance versus frequency.
Figure 1C:
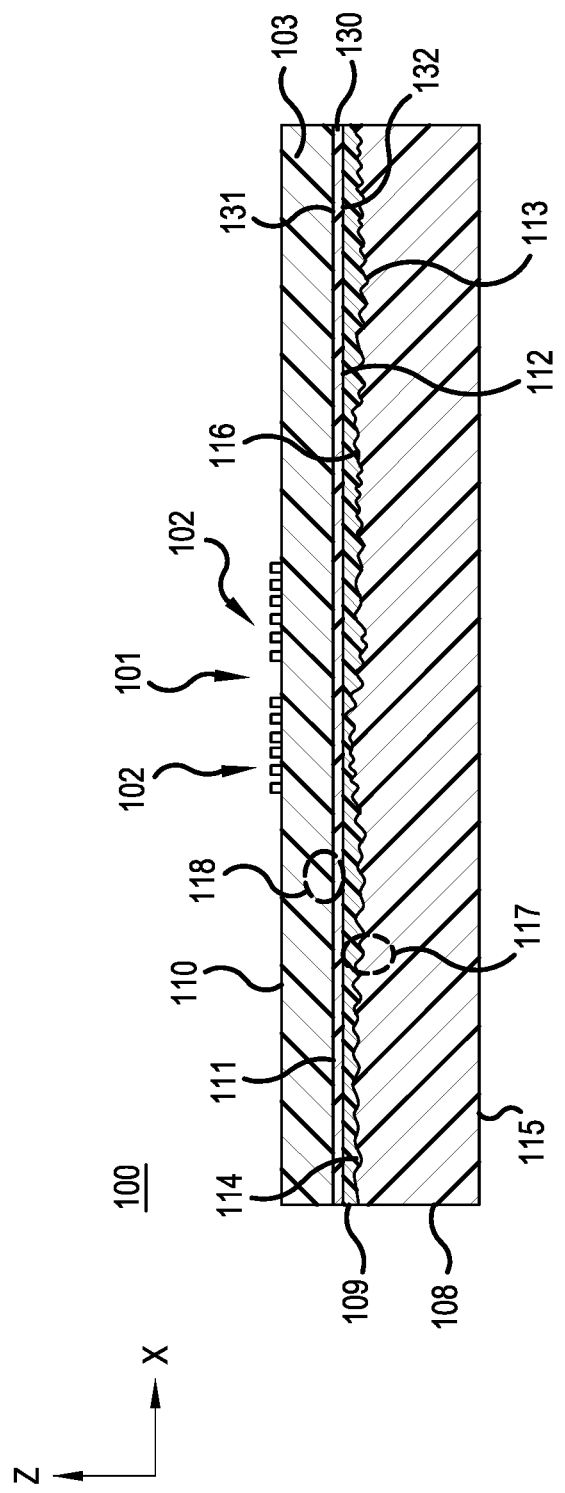
FIG. 1C is the cross-sectional view of a SAW resonator structure of FIG. 1A along line 1C-1C.

Generally, there is a desired fundamental mode, which is typically a Leaky mode, for the SAW resonator structure 100. By way of example, if the piezoelectric layer 103 is a 42° rotated LT, the shear horizontal mode, having a displacement in the plane of the interdigitated electrodes 102 (the x-y plane of the coordinate system of FIG. 1A). The displacement of this fundamental mode is substantially restricted to near the upper surface (first surface 110 as depicted in FIG. 1C) of the piezoelectric layer 103. It is emphasized that the 42° rotated LT piezoelectric layer 103, and the shear horizontal mode are merely illustrative of the piezoelectric layer 103 and desired fundamental mode, and other materials and desired fundamental modes are contemplated.

However, other undesired modes, which are often referred to as spurious modes, are established. Turning to FIG. 1B, a graph of admittance versus frequency is depicted for the illustrative 42° rotated LT piezoelectric layer 103. The desired fundamental mode, the shear horizontal mode 106, is substantially restricted to the upper surface of the piezoelectric layer 103, and has a frequency at series resonance ($F_s$). However, a number of spurious modes 107, having frequencies greater than the frequency at parallel resonance ($F_p$), can exist in the piezoelectric layer 103. As described more fully below, these spurious modes 107 are created by acoustic waves generated in the piezoelectric layer 103 that establish standing waves of various kinds of modes (with different modal shapes and frequencies). More specifically, these spurious modes 107 are created by reflections at the interface of the piezoelectric layer 103 and the substrate (see FIG. 1C) of the SAW resonator structure 100.

The spurious modes can deleteriously impact the performance of SAW resonators, and devices (e.g., filters) that include SAW resonators, if not mitigated. Most notably, if a first filter is comprised of one or more SAW resonators, and is connected to a second filter having a passband that overlaps the frequency of the spurious modes, a sharp reduction in the quality (Q) of the second filter will occur. The spurious modes are observed on a so-called Q-circle of a Smith Chart of the $S_{11}$ parameter. These sharp reductions in Q-factor are known as "rattles," and are strongest in the southeast quadrant of the Q-circle. Beneficially, significant mitigation of the adverse impact of these spurious modes is realized by the various aspects of the present teachings as described below.

FIG. 1C is a cross-sectional view of the SAW resonator structure 100 depicted in FIG. 1A along the lines 1C-1C. The SAW resonator structure 100 comprises a substrate 108 disposed beneath the piezoelectric layer 103, a layer 109 is disposed over the substrate 108, and a silicon layer 130 is disposed between the layer 109 and the piezoelectric layer 103.

As noted above, the piezoelectric layer 103 illustratively comprises one of LN or LT. Generally, in the representative embodiments described below, the piezoelectric layer 103 is a wafer that is previously fabricated, and that is adhered to the silicon layer 130 by atomic bonding as described more fully below.

The materials selected for the piezoelectric layer 103 can be divided into two types: one which has been used for a long time and with a high degree of freedom in design is used for Rayleigh wave substrates; the other, with less freedom and limited in design, is for Leaky wave substrates with low loss characteristics and easily reaches the higher frequencies by high acoustic velocity, and are mainly used for mobile communications. LN and LT materials are often used for broadband filters, and according to the filter specifications the manufacturing materials and cutting angles differ. Filters for applications that require comparatively low loss mainly generally require Leaky wave materials, while Rayleigh wave materials are predominately used for communication equipment that requires low ripple and low group delay characteristics. Among Rayleigh wave materials, ST-cut crystal has the best temperature characteristics as a piezoelectric material.

In accordance with a representative embodiment, the substrate 108 comprises crystalline silicon, which may be polycrystalline or monocrystalline, having thickness of approximately 100.0 µm to approximately 800.0 µm. As will become clearer as the present description continues, the material selected for use as the substrate 108, among other considerations, is selected for ease of micromaching, using one or more of a variety of known techniques. Accordingly, other polycrystalline or monocrystalline materials besides silicon are contemplated for use as the substrate 108 of the SAW resonator structure 100. By way of example, these materials include, but are not limited to, glass, single crystal aluminum oxide ($Al_2O_3$) (sometimes referred to as "sapphire"), and polycrystalline $Al_2O_3$, to name a few. In certain representative embodiments, in order to improve the performance of a filter comprising SAW resonator structure(s) 100, the substrate 108 may comprise a comparatively high-resistivity material. Illustratively, the substrate 108 may comprise single crystal silicon that is doped to a comparatively high resistivity.

The layer 109 is illustratively an oxide material, such as $SiO_2$, or phosphosilicate glass (PSG), borosilicate glass (BSG), a thermally grown oxide, or other material amenable to polishing to a high degree of smoothness, as described more fully below. The layer 109 is deposited by a known method, such as chemical vapor deposition (CVD) or plasma enhanced chemical vapor deposition (PECVD), or may be thermally grown. As described more fully below, the layer 109 is polished to a thickness in the range of approximately 0.05 µm to approximately 6.0 µm.

The silicon layer 130 is illustratively polycrystalline silicon (poly-Si) and is deposited using a known method, such as plasma-enhanced chemical vapor deposition (PECVD) or similar method. After deposition is complete, a cleaning step, such as a known sputtering step, is carried out to remove any oxide or debris from the first surface 131 of the silicon layer 130. This cleaning step fosters bonding of the first surface to the piezoelectric layer 103. This bonding provides good adhesion between the silicon layer 130 and the piezoelectric layer 103.

Illustratively, the silicon layer 130 has a thickness in range of approximately 100 Å to approximately one-third of the wavelength ($\lambda/3$) of a SAW wave, where the wavelength is defined by the pitch of the interdigitated electrodes 102 (IDT) and the velocity of sound in the medium ($L=v_a/2*\text{pitch}$). Generally, the thickness of the silicon layer 130 is selected to be thick enough so that it is atomically smooth and continuous, and not too thick that the desired scattering of spurious modes from the features 116 does not occur. To this end, if the silicon layer 130 is too thin, unevenness across the thickness can result in relative peaks and valleys across the first surface 131 and incomplete coverage of the underlying layer. These peaks and valleys deleteriously reduce the area of contact between the first surface 131 and the second surface 111 of the piezoelectric layer 103. By contrast, if the silicon layer 130 is too thick, the silicon layer 130 is like a substrate without features 116, allowing undesired spurious modes to propagate without incoherent reflection as is realized by the structure of the present teachings.

The piezoelectric layer 103 has a first surface 110, and a second surface 111, which opposed the first surface 110. The layer 109 has a first surface 112 and a second surface 113, and the silicon layer 130 has a first surface 131 and a second surface 132. As depicted in FIG. 1C, the first surface 131 of the silicon layer 130 is atomically bonded to the second surface 111 of the piezoelectric layer 103, as described more fully below.

The substrate 108 has a first surface 114 and a second surface 115 opposing the first surface 114. The first surface 114 has a plurality of features 116 there-across. As noted above, undesired spurious modes are launched in the piezoelectric layer 103, and propagate down to the first surface 114. As described more fully below in connection with portion 117 in FIG. 1D, the plurality of features 116 reflect undesired spurious modes at various angles and over various distances to destructively interfere with the undesired spurious waves in the piezoelectric layer 103, and possibly enable a portion of these waves to be beneficially converted into desired SAW waves. Again as described more fully below, the reflections provided by the plurality of features 116 foster a reduction in the degree of spurious modes (i.e., standing waves), which are created by the reflection of acoustic waves at the interface of the second surface 111 of the piezoelectric layer 103 and the first surface 112 of layer 109. Ultimately, the reflections provided by the plurality of features 116 serve to improve the performance of devices (e.g., filters) that comprise a plurality of SAW resonator structures 100.

As noted above, and as described more fully below in connection with the description of portion 118 in FIG. 1F, in accordance with a representative embodiment, the first (upper) surface 131 of silicon layer 130 is polished, such as by chemical-mechanical polishing in order to obtain a "mirror" like finish with a comparatively low root-mean-square (RMS) variation of height. This low RMS variation of height significantly improves the contact area between the first surface 131 of the silicon layer 130 and the second surface 111 of the piezoelectric layer 103. Accordingly, providing a low RMS variation in height improves the atomic bonding between the first surface 131 and the second surface 111. As is known, the bond strength realized by atomic bonding is directly proportional to the contact area between two surfaces. As such, improving the flatness/smoothness of the first surface 131 fosters an increase in the contact area, thereby improving the bond of the silicon layer 130 to the piezoelectric layer 103. As used herein, the term atomically smooth means sufficiently smooth to provide sufficient contact area to provide a sufficiently strong bond strength between the silicon layer 130 and the piezoelectric layer 103, at the interface of their first and second surfaces 131, 111, respectively.

It is noted that the polishing sequence described above to provide the desired smoothness of the first side 131 of the silicon layer 130 may be foregone if the deposition sequence used to form the silicon layer 130 results in an atomically smooth first side 131.

Figure 1D:
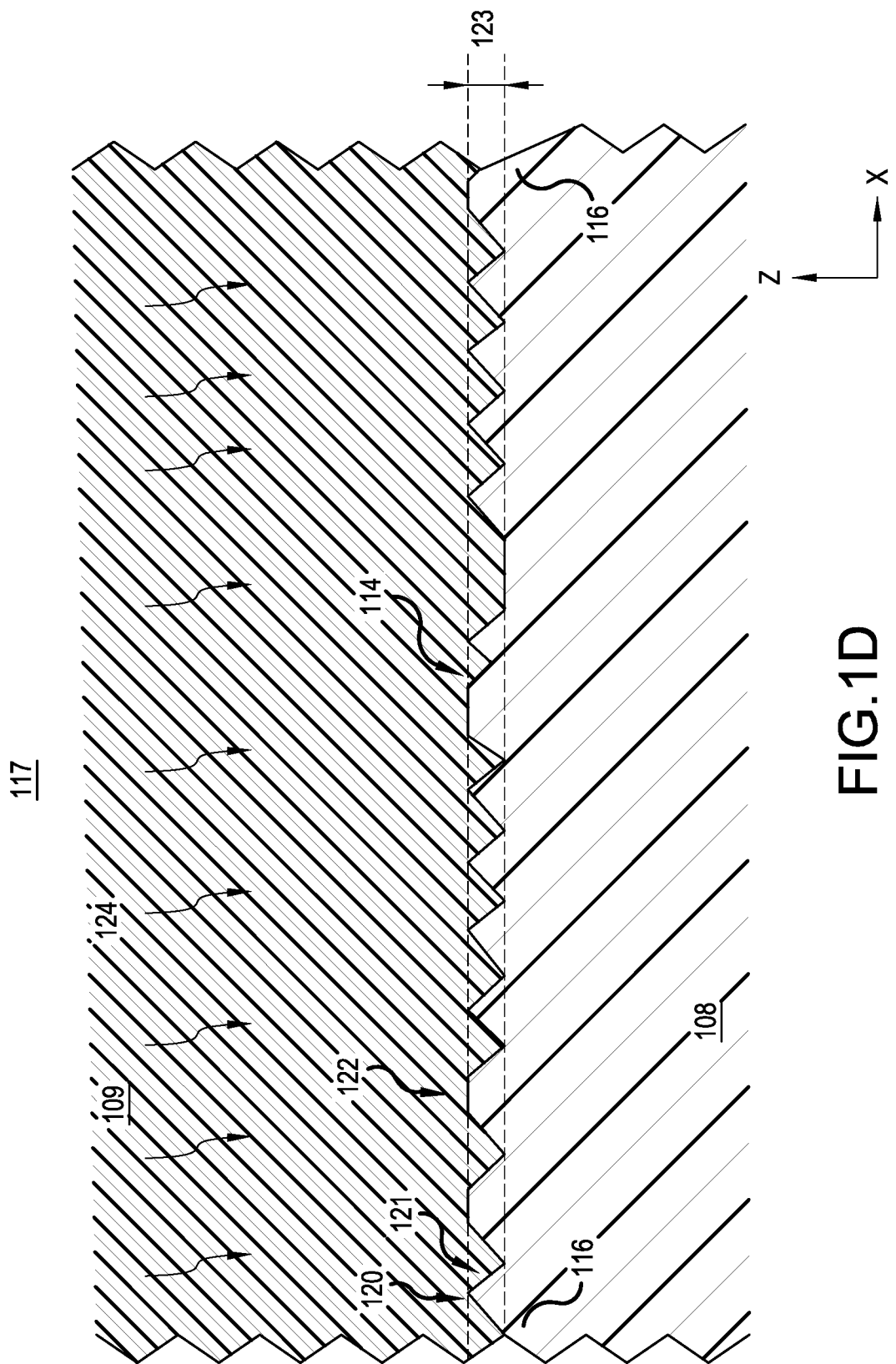
FIG. 1D is a cross-sectional view of a portion of the SAW resonator structure of FIG. 1C.

FIG. 1D is a cross-sectional view of a portion 117 SAW resonator structure 100 according to a representative embodiment. Portion 117 is depicted in FIG. 1C in magnified view to illustrate various aspects and functions of the plurality of features 116 of substrate 108 along the interface of the first surface 114 of the substrate 108 and the second surface 113 of the layer 109.

The shape, dimensions and spacing of the features 116 depends on their method of fabrication. For example, using a known etching technique, the plurality of features 116 are formed in the substrate 108, and may have a generally pyramidal shape 120, with sides 121. Notably, some of the plurality of features 116 may have comparatively "flat" tops 122. The features 116 also have a height 123 that may be substantially the same across the width of the interface between the substrate 108 and the layer 109. Moreover, the width (x-direction in the coordinate system of FIG. 1C) of the features 116 may be the same, or may be different. Generally, however, the width of the features is on the order of the desired fundamental mode of the SAW resonator structure 100.

Alternatively, and again depending on the method of fabrication, the height 123 of the features 116 may not be the same. Rather, by selecting the height 123 of the features to be different, a reduction in the incidence of more than one of the spurious modes can be realized.

The representative method described presently for forming features 116 are merely illustrative. Alternative methods, and thus alternative sizes and shapes of the features 116 are contemplated, and some are described below. Notably, regardless of the method used for their fabrication, the plurality of features 116 is beneficially not arranged in a repetitive pattern, and thus is non-periodic. Rather, the plurality of features 116 is typically randomly located on the substrate 108, in order to avoid establishing conditions that would support standing waves (i.e., resonance conditions) in the piezoelectric layer 103, and thereby reduce the incidence of spurious modes in the piezoelectric layer 103.

The substrate 108 is illustratively single-crystal silicon, or other material having crystalline properties. The present teachings make use of the etching properties of the substrate 108 to realize the various characteristics of the features 116. In one representative embodiment, the features 116 are formed by etching the substrate 108 along crystalline planes. In this case, the features 116 having pyramidal shapes 120 and sides 121 that are on a "slant" foster reflections at off-angles relative to the incident direction of the acoustic waves 124.

Turning again to FIG. 1C, acoustic waves 124 are transmitted downwardly from the piezoelectric layer 103, having been generated by the SAW resonator structure 100, and travel through the layer 109. The acoustic waves 124 are incident on one or more of the plurality of features 116, and are reflected therefrom.

As noted above in connection with the description of FIG. 1B, there are multiple spurious modes, each having a different frequency and wavelength. In accordance with a representative embodiment, the height 123 of the features 116 of the substrate 108 is approximately one-fourth (¼) λ of one or more of the spurious modes. Selecting the height 123 of the features to be approximately one-fourth (¼) λ of a particular spurious mode alters the phase of the reflected waves, and results in destructive interference by the reflected waves, and substantially prevents the establishment of standing waves, and thus spurious modes.

In some embodiments, the height 123 of the features 116 is substantially the same, and the height 123 is selected to be approximately one-fourth (¼) λ of one (e.g., a predominant) of the spurious modes. In other embodiments, the height 123 of the features 116 is not the same, but rather each different height is selected to be approximately equal to one-fourth (¼) λ of one of the multiple spurious modes (e.g., the spurious modes 107 depicted in FIG. 1B). By selecting this one height or multiple heights, the phase of the reflected waves is altered, and results in destructive interference by the reflected waves, thereby substantially preventing the establishment of standing waves of multiple frequencies, thus preventing the establishment of multiple spurious modes.

By way of example, if the spurious modes have a frequency of 700 MHz, the wavelength λ is approximately 6.0 µm. As such, the height 123 would be approximately 1.5 µm. By contrast, if the spurious modes have a frequency of 4200 MHz, the λ is approximately 1.0 µm. In this example, the height 123 would be approximately 0.25 µm. More generally, the height 123 is in the range of less than approximately 0.25 µm (e.g., 0.1 µm) to greater than approximately 1.5 µm (e.g., 2.5 µm). As will be appreciated, the range for the height depends on the frequency of the fundamental mode.

The non-periodic orientation of the plurality of features 116, the generally, angled surfaces (e.g., side 121) provided by the plurality of features 116, and providing the height 123 of the features 116 to be in the noted range relative to the wavelength of the propagating spurious modes combine to alter the phase of the acoustic waves 124 incident on the various features. Beneficially, these factors in combination result in comparatively diffuse reflection of the acoustic wave back through the layer 109 and into the piezoelectric layer 103. This comparatively diffuse reflection of the acoustic waves from the features 116 will generally not foster constructive interference, and the establishment of resonance conditions. Accordingly, the plurality of features 116 generally prevents the above-noted parasitic acoustic standing waves (i.e., spurious modes) from being established from the acoustic waves 124 generated in the piezoelectric layer 103, which travel down and into the substrate 108.

One measure of the impact of the parasitic spurious modes on the performance of a device (e.g., filter) comprising a SAW resonator is the quality (Q) factor. For example, the parasitic spurious modes couple at the interfaces of the piezoelectric layer 103 and remove energy available for the desired SAW modes and thereby reduce the Q-factor of the resonator device. As is known, the Q-circle of Smith Chart has a value of unity along its circumferences. The degree of energy loss (and therefore reduction in Q) is depicted with the reduction of the $S_{11}$ parameter off the unit circle. Notably, as a result of parasitic spurious modes and other acoustic losses, sharp reductions in Q of known devices can be observed on a so-called Q-circle of a Smith Chart of the $S_{11}$ parameter. These sharp reductions in Q-factor are known as "rattles," and are strongest in the southeast quadrant of the Q-circle. Beneficially, because of the diffuse reflections, and attendant phase mismatch of the reflected acoustic waves 124 realized by the plurality of features 116, compared to such known devices, a filter comprising SAW resonator structure 100 of representative embodiments of the present teachings, show lesser magnitudes of the "rattles," and a somewhat "spreading" of the reduced "rattles," is experienced.

As noted above, the plurality of features 116 may be formed by etching the substrate 108 to reveal crystalline planes, which thereby form the pyramidal shapes 120. In one embodiment, the substrate is substantially monocrystalline silicon that is selectively etched to reveal well defined crystalline planes with precise orientations. By way of example, selective masking of the substrate 108 having major surfaces lying in the (110) crystalline plane is initially carried. Illustratively, an etch resistant mask of $SiO_2$ is patterned using a buffered HF, and etching is effected by the use of an anisotropic etchant such as KOH. As is known, the depth of the etch is directly proportional to the width of the etch in this self-limiting process. This particular orientation of substrate will allow for etching to reveal sides 121 in a certain (e.g., (111)) family of planes.

In one representative method, the etch mask is patterned to provide "dots" in rather random locations over the first surface 114 of the substrate 108. After etching, these "dots" are removed, and show the comparative "flat" tops 122 of certain ones of the plurality of features 116. The spacing of the "dots" and the duration of the etch, to the self-limiting end, determines the depth of each etch, and therefore, the height 123 of the resultant features 116.

Again, the use of monocrystalline silicon for the substrate 108 is merely illustrative, and other materials can be processed to provide the plurality of features 116 described above.

In other representative embodiments, the plurality of features 116 has random spacing, or random orientation, or random heights, or a combination thereof. As can be appreciated, such random spacings, orientations and heights, alone or in combination can foster comparatively diffuse reflection of the acoustic waves 124 incident thereon. This diffuse reflection, in turn, alter the phase of the acoustic waves, and serves to reduce the propensity of standing waves (and thus spurious modes) from being established.

The random spacing, orientation, and heights of the plurality of features can be effected by a number of methods. For example, the plurality of features 116 may be provided by simply using an unpolished wafer for the substrate 108.

Alternatively, the second surface 115 of the substrate 108 could be rough polished by CMP, for example. While the plurality of features 116 of such an embodiment would likely not have the height relative to the wavelength of the spurious modes, the random nature of such an unpolished surface would likely provide a useful degree of diffusive reflection to avoid the establishment of a resonant condition for the spurious modes.

Figure 1E:
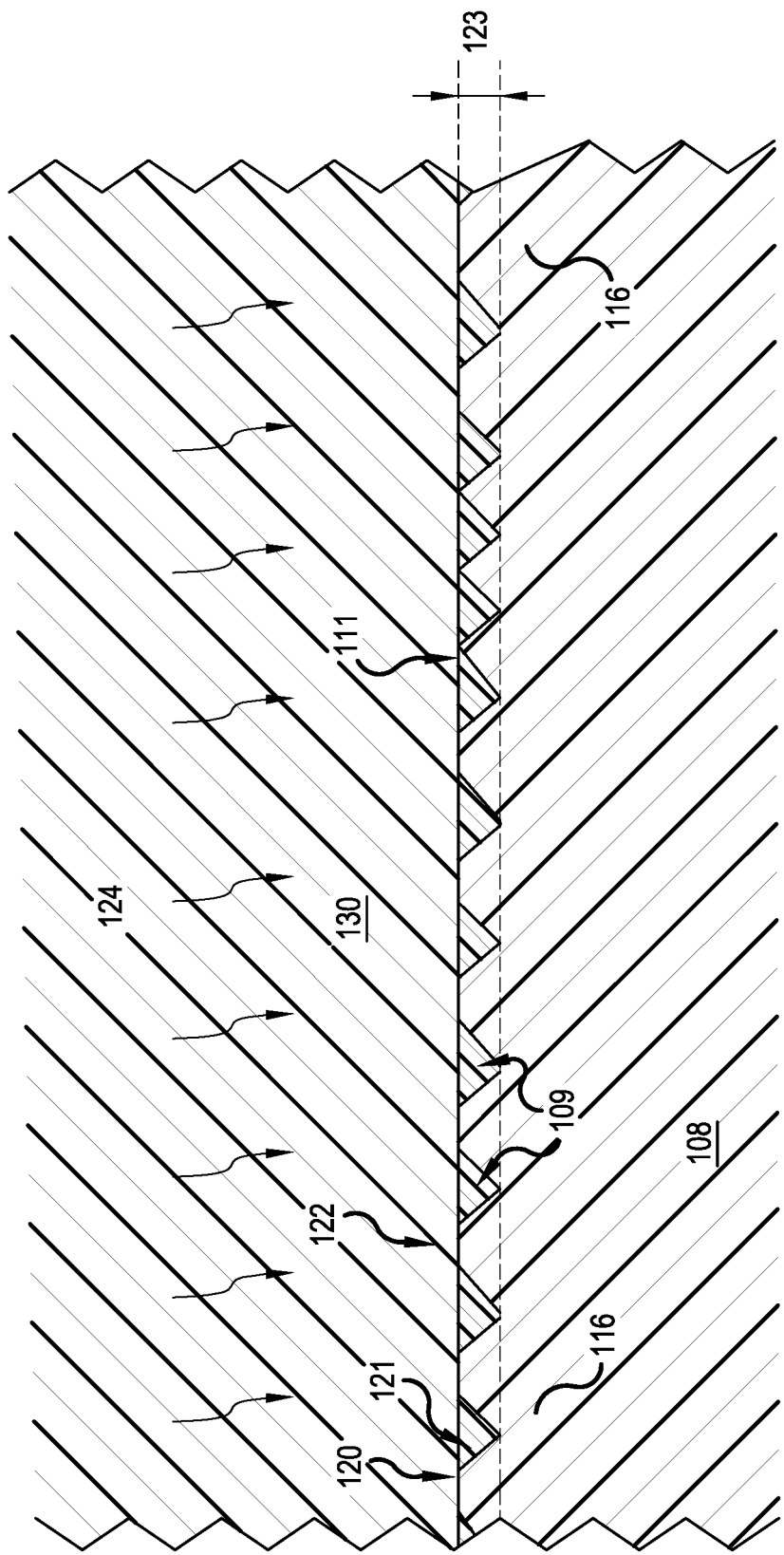
FIG. 1E is a cross-sectional view of a portion of a SAW resonator structure in accordance with a representative embodiment.

FIG. 1E is a cross-sectional view of a portion of a SAW resonator structure according to a representative embodiment. Many aspects and details of the various features and their methods of fabrication described in connection with the representative embodiments of FIG. 1E are common to those described above in connection with the representative embodiments of FIGS. 1A-1D. Such common aspects and details are often not repeated in order to avoid obscuring the description of the present representative embodiments.

Notably, the portion depicted in FIG. 1E is somewhat similar to portion 117 depicted in FIG. 1D, however differs in the depth of the polishing step used to provide first surface 112. Specifically, rather than terminating the polishing of the layer 109 at a height significantly above the features 116, the polishing step continues and in places reveals the features 116. This polishing step thus provides, in places, comparatively "flat" tops 122. By contrast, in other places, the features 116 are not altered by the polishing.

Like the plurality of features 116 depicted in FIG. 1D, the features 116 of the representative embodiments of FIG. 1E are formed by etching the substrate 108 along crystalline planes. In this case, the features 116 having pyramidal shapes 120 and sides 121 that are on a "slant" foster reflections at off-angles relative to the incident direction of the acoustic waves 124. Similarly, like the plurality of features 116 of FIG. 1D, the height 123 of the plurality of features 116 of the representative embodiments of FIG. 1E is approximately one-fourth (¼) λ of one or more of the spurious modes. Selecting the height 123 of the features to be approximately one-fourth (¼) λ of a particular spurious mode alters the phase of the reflected waves, and results in destructive interference by the reflected waves, and substantially prevents the establishment of standing waves, and thus spurious modes.

In some embodiments, the height 123 of the features 116 is substantially the same, and thus the height 123 is selected to be approximately one-fourth (¼) λ of one (e.g., a predominant) spurious mode. In other embodiments, the height 123 of the features 116 is not the same, but rather each different height is selected to be approximately equal to one-fourth (¼) λ of one of the multiple spurious modes (e.g., one of the spurious modes 107 depicted in FIG. 1B). By selecting such multiple heights, the phase of the reflected waves is altered, and results in destructive interference by the reflected waves, thereby substantially preventing the establishment of standing waves of multiple frequencies, thus preventing the establishment of multiple spurious modes.

In other representative embodiments, the plurality of features 116 has random spacing, or random orientation, or random heights, or a combination thereof. As can be appreciated, such random spacing, orientations and heights, alone or in combination can foster comparatively diffuse reflection of the acoustic waves 124 incident thereon. This diffuse reflection, in turn, alters the phase of the acoustic waves, and serves to reduce the propensity of standing waves (and thus spurious modes) from be established.

The random spacing, orientation, and heights of the plurality of features can be effected by a number of methods. For example, the plurality of features 116 may be provided by simply using an unpolished wafer for the substrate 108. Alternatively, the second surface 115 of the substrate 108 could be rough polished by CMP, for example. While the plurality of features 116 of such an embodiment would likely not have the height relative to the wavelength of the spurious modes, the random nature of such an unpolished surface would likely provide a useful degree of diffusive reflection to avoid the establishment of a resonant condition for the spurious modes.

Figure 1F:
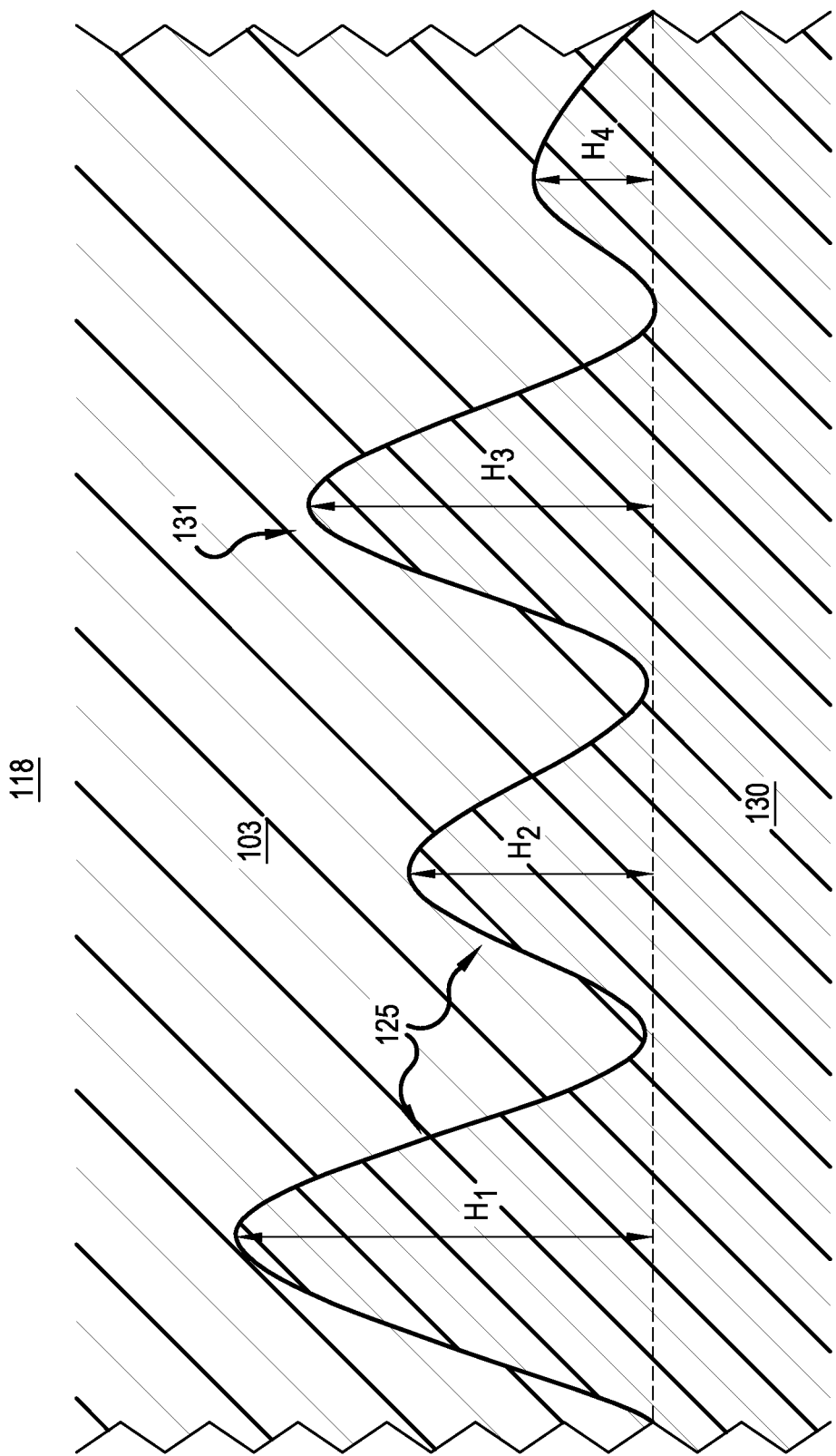
FIG. 1F is a cross-sectional view of a portion the SAW resonator structure of FIG. 1C.

FIG. 1F is a cross-sectional view of a portion 118 SAW resonator structure 100 according to a representative embodiment. Portion 118 is depicted in FIG. 1F in magnified view to illustrate various aspects and functions of the layer 109 along the interface of the silicon layer 130 and the piezoelectric layer 103.

As noted previously, silicon layer 130 is deposited using a known method, such as plasma-enhanced chemical vapor deposition (PECVD), or other methods useful to form the silicon layer 130 suitable for use in connection with the present teachings. In some cases, at the atomic level, the surface of the silicon layer 130 deposited or otherwise formed using known methods may be atomically very rough. By polishing the first surface 131 of the silicon layer 130 an atomically smooth surface is created. The first surface 131 of the silicon layer 130 is first planarized by polishing with a slurry, using a known CMP method. The remaining silicon can then be polished using a more refined slurry. Alternatively, a single more refined slurry can be used for both polishing steps if the additional polishing time is not objectionable. As noted above, the goal is to create a "mirror" like finish that is atomically smooth in order to foster strong atomic bonding between the silicon layer 130 and the piezoelectric layer 103, at the interface of their first and second surfaces 131, 111 respectively.

FIG. 1F depicts four "humps" 125 in the layer after the completion of the cleaning of the wafer described above. The "humps" depict variation in the first surface 131. The first hump has a first height, $H_1$, the second hump has a second height, $H_2$, the third hump has a third height, $H_3$, and the fourth hump has a fourth height, $H_4$. For the purposes of illustration, only four humps are shown. The root mean squared (RMS) variation in the height of the first surface 131 of the silicon layer 130 comprised of the four humps depicted is less than approximately 0.5 μm. As noted above, the term atomically smooth herein means sufficiently smooth to provide sufficient contact area to provide a sufficiently strong bond strength between the silicon layer 130 and the piezoelectric layer 103, at the interface of their first and second surfaces 131, 111, respectively. Such an atomically smooth surface can be realized by providing the first surface 131 of silicon layer 130 having an RMS variation in height in the range of approximately 0.1 Å to approximately 10.0 Å; although beneficially, the RMS variation in height is less than approximately 5.0 Å.

As noted above, the forming of an atomically smooth first surface 131 provides an increased contact area at the interface of the first and second surfaces 131, 111, respectively, of the silicon layer 130 and the piezoelectric layer 103. This increased contact area, in turn, fosters a comparatively strong atomic bond between the silicon layer 130 and the piezoelectric layer 103. Among other benefits, the strong atomic bond between the silicon layer 130 and the piezoelectric layer 103 reduces separation or delamination of the silicon layer 130 and the piezoelectric layer 103, thereby increasing the reliability of devices comprising the SAW resonator structure 100 over time.

As noted above, when connected in a selected topology, a plurality of SAW resonators can function as an electrical filter. FIG. 2 shows a simplified schematic block diagram of an electrical filter 200 in accordance with a representative embodiment. The electrical filter 200 comprises series SAW resonators 201 and shunt SAW resonators 202. The series SAW resonators 201 and shunt SAW resonators 202 may each comprise SAW resonator structures 100 described in connection with the representative embodiments of FIGS. 1A~1F. As can be appreciated, the SAW resonator structures (e.g., a plurality of SAW resonator structures 100) that comprise the electrical filter 200 may be provided over a common substrate (e.g., substrate 108), or may be a number of individual SAW resonator structures (e.g., SAW resonator structures 100) disposed over more than one substrate (e.g., more than one substrate 108). The electrical filter 200 is commonly referred to as a ladder filter, and may be used for example in duplexer applications. It is emphasized that the topology of the electrical filter 200 is merely illustrative and other topologies are contemplated. Moreover, the acoustic resonators of the representative embodiments are contemplated in a variety of applications including, but not limited to duplexers.

The various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. A surface acoustic wave (SAW) resonator structure, comprising:
   a substrate having a first surface and a second surface, the first surface having a plurality of features;
   a piezoelectric layer disposed over the substrate, the piezoelectric layer having a first surface and a second surface;
   a plurality of electrodes disposed over the first surface of the piezoelectric layer, the plurality of electrodes configured to generate surface acoustic waves in the piezoelectric layer; and
   a layer disposed over the first surface of the substrate, the layer having a first surface and a second surface; and
   a polycrystalline silicon layer having a first surface and a second surface, the polycrystalline silicon layer being disposed between the first surface of the layer and the second surface of the piezoelectric layer, the first surface of the polycrystalline silicon layer having a smoothness sufficient to foster atomic bonding between the first surface of the polycrystalline silicon layer and the second surface of the piezoelectric layer, wherein the plurality of features reflect acoustic waves and reduce an incidence of spurious modes in the piezoelectric layer.

2. A SAW resonator structure as claimed in claim 1, wherein the layer is disposed beneath the second surface of the polycrystalline silicon layer, the first surface of the layer having a smoothness sufficient to foster atomic bonding between the first surface of the layer and the second surface of the polycrystalline silicon layer.

3. A SAW resonator structure as claimed in claim 1, wherein the polycrystalline silicon layer has a thickness in a range of approximately 100 Å to approximately $\lambda/3$ where $\lambda$ is a wavelength of surface acoustic waves generated in the piezoelectric layer.

4. A SAW resonator structure as claimed in claim 1, wherein the reflected acoustic waves destructively interfere with acoustic waves in the piezoelectric layer.

5. A SAW resonator structure as claimed in claim 1, wherein the features in the first surface of the substrate are substantially pyramidal in shape.

6. A SAW resonator structure as claimed in claim 5, wherein the features are substantially not in a regular pattern.

7. A SAW resonator structure as claimed in claim 5, wherein the features have a height of approximately one-fourth of a wavelength ($\frac{1}{4} \lambda$) of a spurious mode.

8. A SAW resonator structure as claimed in claim 5, wherein the features have a height in a range of approximately 0.25 µm to approximately 1.5 µm.

9. A SAW resonator structure as claimed in claim 5, wherein the features have a height in a range of approximately 0.1 µm to approximately 2.50 µm.

10. A SAW resonator structure as claimed in claim 5, wherein the features have a plurality of heights, and each of the pluralities of heights is approximately a height in a range of approximately one-fourth of a wavelength ($\frac{1}{4} \lambda$) of the spurious modes.

11. A SAW resonator structure as claimed in claim 1, wherein the layer comprises an oxide material.

12. A SAW resonator structure as claimed in claim 11, wherein the oxide material comprises silicon dioxide ($SiO_2$).

13. A SAW resonator structure as claimed in claim 11, wherein the first surface of the layer has a root-mean-square (RMS) variation in height of approximately 0.1 Å to approximately 10.0 Å.

14. A surface acoustic wave (SAW) filter comprising a plurality of SAW resonator structures, one or more of the plurality of SAW resonator structures comprising:
   a substrate having a first surface and a second surface, the first surface having a plurality of features;
   a piezoelectric layer disposed over the substrate, the piezoelectric layer having a first surface and a second surface;
   a plurality of electrodes disposed over the first surface of the piezoelectric layer, the plurality of electrodes configured to generate surface acoustic waves in the piezoelectric layer, and
   a layer disposed over the first surface of the substrate, the layer having a first surface and a second surface; and
   a polycrystalline silicon layer having a first surface and a second surface, the polycrystalline silicon layer being disposed between the first surface of the layer and the second surface of the piezoelectric layer, the first surface of the polycrystalline silicon layer having a smoothness sufficient to foster atomic bonding between the first surface of the polycrystalline silicon layer and the second surface of the piezoelectric layer, wherein the plurality of features reflect acoustic waves and reduce an incidence of spurious modes in the piezoelectric layer.

15. A SAW filter as claimed in claim 14, wherein the layer is disposed beneath the second surface of the polycrystalline silicon layer, the first surface of the layer having a smoothness sufficient to foster atomic bonding between the first surface of the layer and the second surface of the polycrystalline silicon layer.

16. A SAW filter as claimed in claim 14, wherein the polycrystalline silicon layer has a thickness in a range of approximately 100 Å to approximately $\lambda/3$ where $\lambda$ is a wavelength of surface acoustic waves generated in the piezoelectric layer.

17. A SAW filter as claimed in claim 14, wherein the reflected acoustic waves destructively interfere with acoustic waves in the piezoelectric layer.

18. A SAW filter as claimed in claim 14, wherein the features in the first surface of the substrate are substantially pyramidal in shape.

19. A SAW filter as claimed in claim 18, wherein the features are substantially not in a regular pattern.

20. A SAW filter as claimed in claim 18, wherein the features have a height of approximately one-fourth of a wavelength (¼ λ) of a spurious mode.

21. A SAW filter as claimed in claim 20, wherein the features have a height in a range of approximately 0.25 μm to approximately 1.5 μm.

22. A SAW filter as claimed in claim 20, wherein the features have a height in a range of approximately 0.1 μm to approximately 2.50 μm.

23. A SAW filter as claimed in claim 14, wherein the features have a plurality of heights, and each of the pluralities of heights is approximately a height in a range of approximately one-fourth of a wavelength (¼ λ) of the spurious modes.

24. A SAW filter as claimed in claim 14, wherein the SAW filter is a ladder filter, comprising the plurality of SAW resonator structures.

25. A SAW filter as claimed in claim 14, wherein the layer comprises an oxide material.

26. A SAW filter as claimed in claim 25, wherein the oxide material comprises silicon dioxide ($SiO_2$).

27. A SAW filter as claimed in claim 25, wherein the first surface of the layer has a root-mean-square (RMS) variation in height of approximately 1.0 Å to approximately 10.0 Å or less.

28. A SAW filter as claimed in claim 14, wherein two or more of the plurality of SAW resonator structures are configured in a series and shunt configuration.

29. A surface acoustic wave (SAW) resonator structure, comprising:
   a substrate having a first surface and a second surface, the first surface having a plurality of features;
   a piezoelectric layer disposed over the substrate, the piezoelectric layer having a first surface and a second surface;
   a plurality of electrodes disposed over the first surface of the piezoelectric layer, the plurality of electrodes configured to generate surface acoustic waves in the piezoelectric layer; and
   a layer disposed over the first surface of the substrate, the layer having a first surface and a second surface; and
   a silicon layer comprising a first surface and a second surface, and having a thickness in a range of approximately 100 Å to approximately λ/3 where λ is a wavelength of the surface acoustic waves generated in the piezoelectric layer, the silicon layer being disposed between the first surface of the layer and the second surface of the piezoelectric layer, the first surface of the silicon layer having a smoothness sufficient to foster atomic bonding between the first surface of the silicon layer and the second surface of the piezoelectric layer, wherein the plurality of features reflect acoustic waves and reduce an incidence of spurious modes in the piezoelectric layer.

30. A SAW resonator structure as claimed in claim 29, wherein the features in the first surface of the substrate are substantially pyramidal in shape.

31. A SAW resonator structure as claimed in claim 30, wherein the features are substantially not in a regular pattern.

32. A SAW resonator structure as claimed in claim 30, wherein the features have a height of approximately one-fourth of a wavelength (¼ λ) of a spurious mode.

33. A SAW resonator structure as claimed in claim 30, wherein the features have a height in a range of approximately 0.25 μm to approximately 1.5 μm.

34. A SAW resonator structure as claimed in claim 30, wherein the features have a height in a range of approximately 0.1 μm to approximately 2.50 μm.

35. A SAW resonator structure as claimed in claim 30, wherein the features have a plurality of heights, and each of the pluralities of heights is approximately a height in a range of approximately one-fourth of a wavelength (¼ λ) of the spurious modes.

36. A SAW resonator structure as claimed in claim 29, wherein the layer comprises an oxide material.

37. A SAW resonator structure as claimed in claim 36, wherein the oxide material comprises silicon dioxide ($SiO_2$).

38. A SAW resonator structure as claimed in claim 36, wherein the first surface of the layer has a root-mean-square (RMS) variation in height of approximately 0.1 Å to approximately 10.0 Å.

* * * * *